(12) United States Patent
Warwar

(10) Patent No.: US 6,229,344 B1
(45) Date of Patent: May 8, 2001

(54) PHASE SELECTION CIRCUIT

(75) Inventor: Greg Warwar, Santa Paula, CA (US)

(73) Assignee: Vitesse Semiconductor Corp., Camarillo, CA (US)

( * ) Notice: Subject to any disclaimer, the term of this patent is extended or adjusted under 35 U.S.C. 154(b) by 0 days.

(21) Appl. No.: 09/265,725

(22) Filed: Mar. 9, 1999

(51) Int. Cl.[7] .................................................. H03K 5/13
(52) U.S. Cl. ........................................... 327/3; 327/407
(58) Field of Search ........................... 327/231, 237, 327/238, 239, 246, 247, 254, 255, 256, 257, 258, 259, 261, 263, 264, 266, 276, 280, 407, 408, 299, 99, 271, 274, 277, 2, 298, 3, 409, 12

(56) References Cited

U.S. PATENT DOCUMENTS

| | | | |
|---|---|---|---|
| 5,552,745 | * | 9/1996 | Pelella .................................. 327/407 |
| 5,570,294 | * | 10/1996 | McMinn et al. ...................... 364/481 |
| 5,668,495 | * | 9/1997 | Vora et al. ............................ 327/432 |
| 5,717,362 | * | 2/1998 | Maneatis et al. ....................... 331/57 |
| 6,034,570 | * | 3/2000 | Warwar ................................... 331/57 |

* cited by examiner

*Primary Examiner*—Toan Tran
*Assistant Examiner*—Linh Nguyen
(74) *Attorney, Agent, or Firm*—Christie, Parker & Hale, LLP

(57) ABSTRACT

Phase selection circuit for selecting a phase from signal source generating a multi-phase clock signal is implemented utilizing a single stage of multiplexing gates for receiving taps from signal source, thus minimizing mismatch between phases. Multiplexing gates, connected together at their outputs, select between a tap and an inverse tap and are always left on. The outputs from multiplexing gates are analog summed together to create a single phase output signal which may be shifted in phase by one tap simply by inverting one of the input taps to a multiplexing gate, thus reducing glitching at output signal. Phase interpolation is provided for by further phase shifting the output in steps smaller than one tap utilizing multiplexor circuit which interpolates in multiple steps between a tap and inverse tap. Phase selection circuit provides for provides maximum bandwidth capability, while minimizing mismatch and glitching.

21 Claims, 5 Drawing Sheets

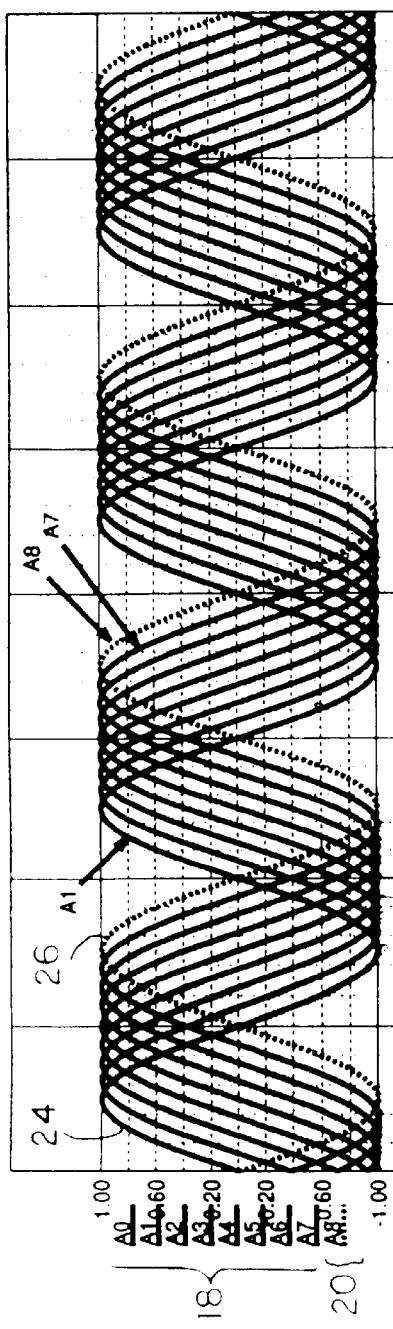
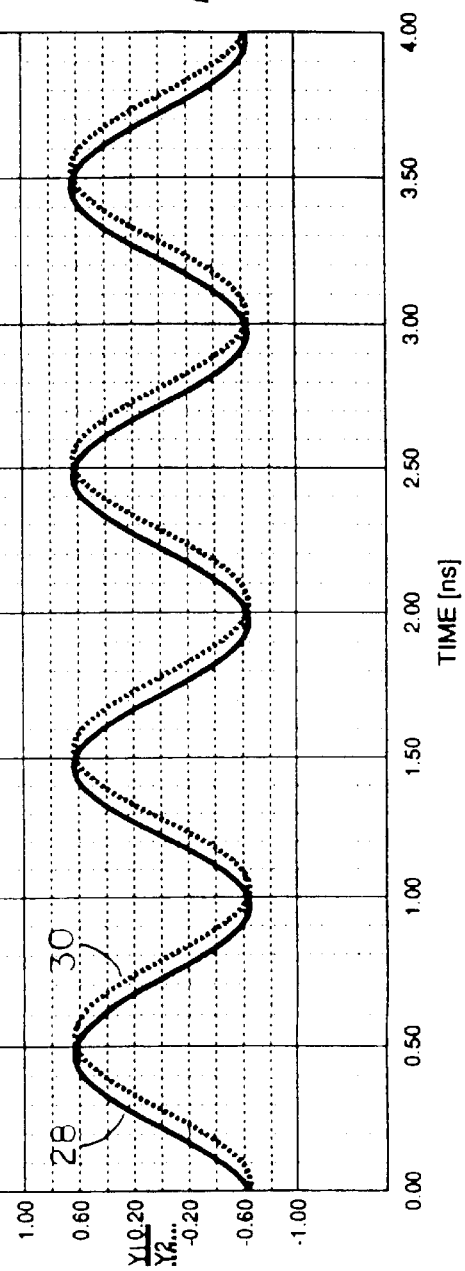
FIG. 3(a)
FIG. 3(b)

PHASE SELECTION CIRCUIT

BACKGROUND OF THE INVENTION

1. Field of the Invention

This invention relates generally to digital communications, and more specifically to phase selection circuits.

2. Description of the Prior Art

For many applications in integrated circuit (IC) design, signal source such as a voltage controlled oscillator (VCO) is utilized to generate a multi-phase clock signal. A phase selection circuit is typically utilized in conjunction with signal source to select desired phases. Conventional phase selection circuits suffer from various shortcomings, however, including but not limited to, bandwidth, mismatch and/or glitching problems. For example, one known phase selection circuit utilizes several stages of multiplexing gates for selecting a desired output phase signal, with each gate being enabled by a select input signal. The signals applied to the phase selection circuit must pass through several stages of gates. As the signals pass through each stage of gates, the amount of mismatch caused by the time delay between phases increases. Moreover, the amount of mismatch increases as the number of phases increases. Another problem associated with multi-stage phase selection circuits is that the resultant output phase signal is subject to perturbation or glitching when the select input signals for the gates are changed. This can be improved somewhat by arranging the select input signals so that the select coding changes from a binary to a Gray code (i.e., a binary code in which sequential numbers are represented by binary expressions each of which differs from the preceding expression by one place only). While utilizing a Gray code helps, perturbation or glitching of the output phase signal remains problematic, particularly when the select inputs for the gates are changed asynchronously.

Another conventional phase selection approach utilizes tristateable multiplexors for selecting a desired output phase signal, with each multiplexor enabled by a select input signal. All of the phases applied to a tristateable phase selection circuit are shorted together through tristateable buffers. This approach suffers from various shortcomings, however, including limited bandwidth availability caused by excessive loading of all of the disabled drivers connected to an output node. Additionally, perturbation or glitching at the output phase signal remains problematic.

What is needed therefore is an apparatus and method for phase selection which provides for maximum bandwidth capability while minimizing phase mismatch and glitching at the output phase signal.

SUMMARY OF THE INVENTION

The present invention provides, in a first aspect, a phase selection circuit for selecting a phase from a signal source generating phase signals, including a single stage of multiplexor circuits for receiving phase signals from said signal source, wherein said multiplexor circuits are connected together at their outputs and said phase is shifted by inverting one of said phase signals to said multiplexor circuit.

In another aspect, the present invention provides a method for selecting a phase, including the steps of generating a plurality of phase signals, receiving the plurality of phase signals using a single stage of multiplexor circuits connected together at their outputs, and inverting one of the plurality of phase signals to the multiplexor circuit to select the phase.

These and other features and advantages of this invention will become further apparent from the detailed description and accompanying figures that follow. In the figures and description, numerals indicate the various features of the invention, like numerals referring to like features throughout both the drawing figures and the written description.

BRIEF DESCRIPTION OF THE DRAWINGS

FIG. 3($a$) is a graph showing phase signals, corresponding to delay taps A0 through A8, which are applied to the phase selection circuit illustrated in FIG. 2.

FIG. 3($b$) is a graph showing output phase signal $Y_1$, generated by adding phase signals corresponding to delay taps A0 through A7 illustrated in FIG. 3($a$), and output phase signal $Y_2$, generated by adding phase signals corresponding to delay taps A1 through A8 illustrated in FIG. 3($a$).

DETAILED DESCRIPTION OF THE PREFERRED EMBODIMENT(S)

Figure 1:
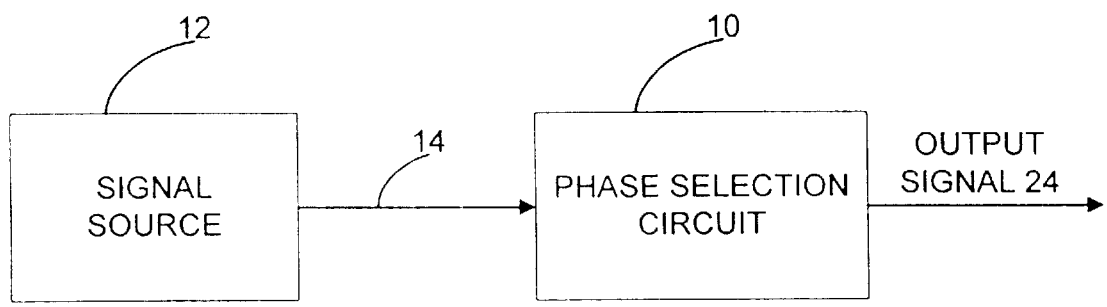
FIG. 1 is a block diagram of a phase selection circuit according to the present invention.
Figure 2:
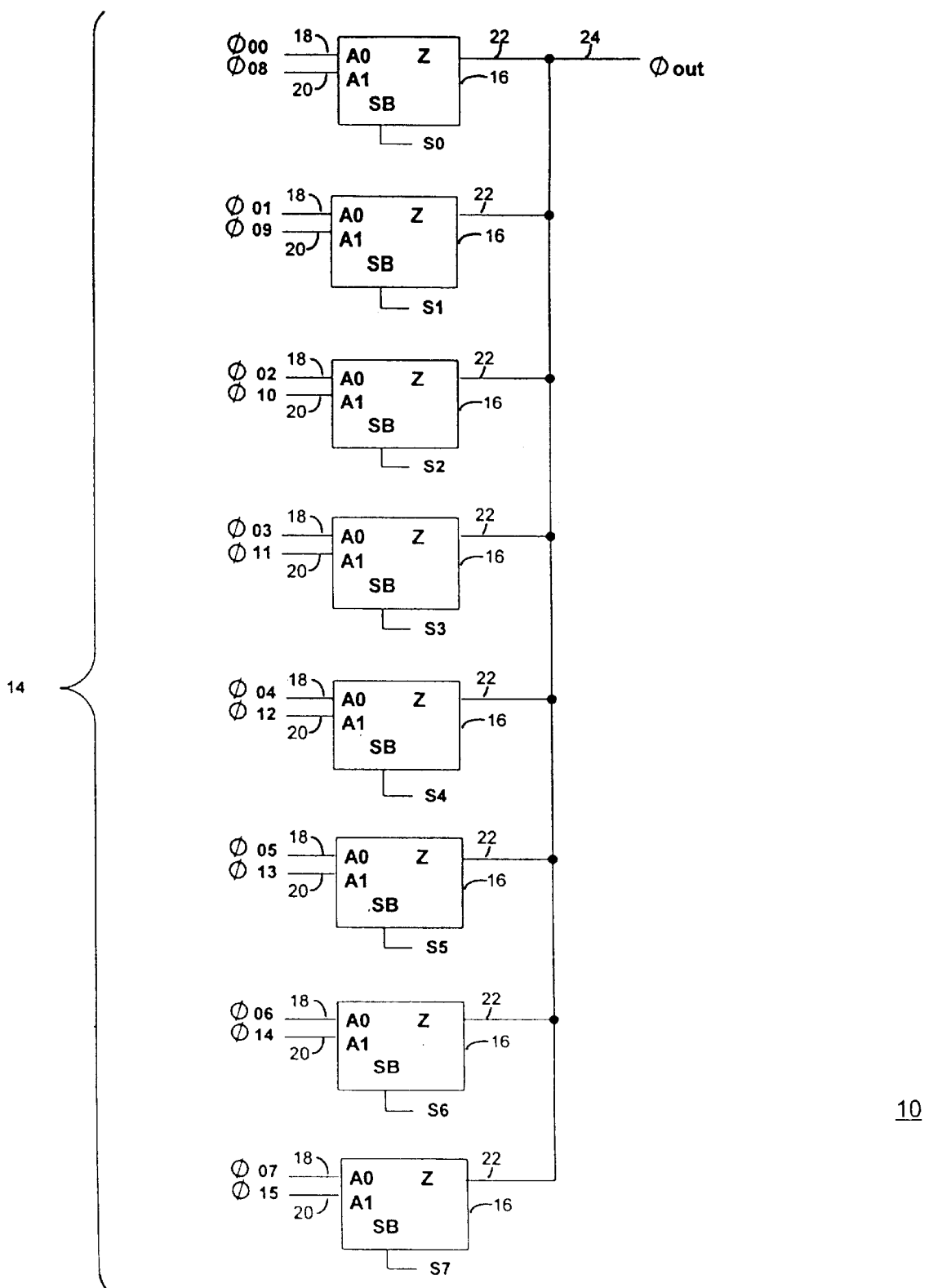
FIG. 2 is a detailed diagram of a phase selection circuit illustrated in FIG. 1.
Figure 5:
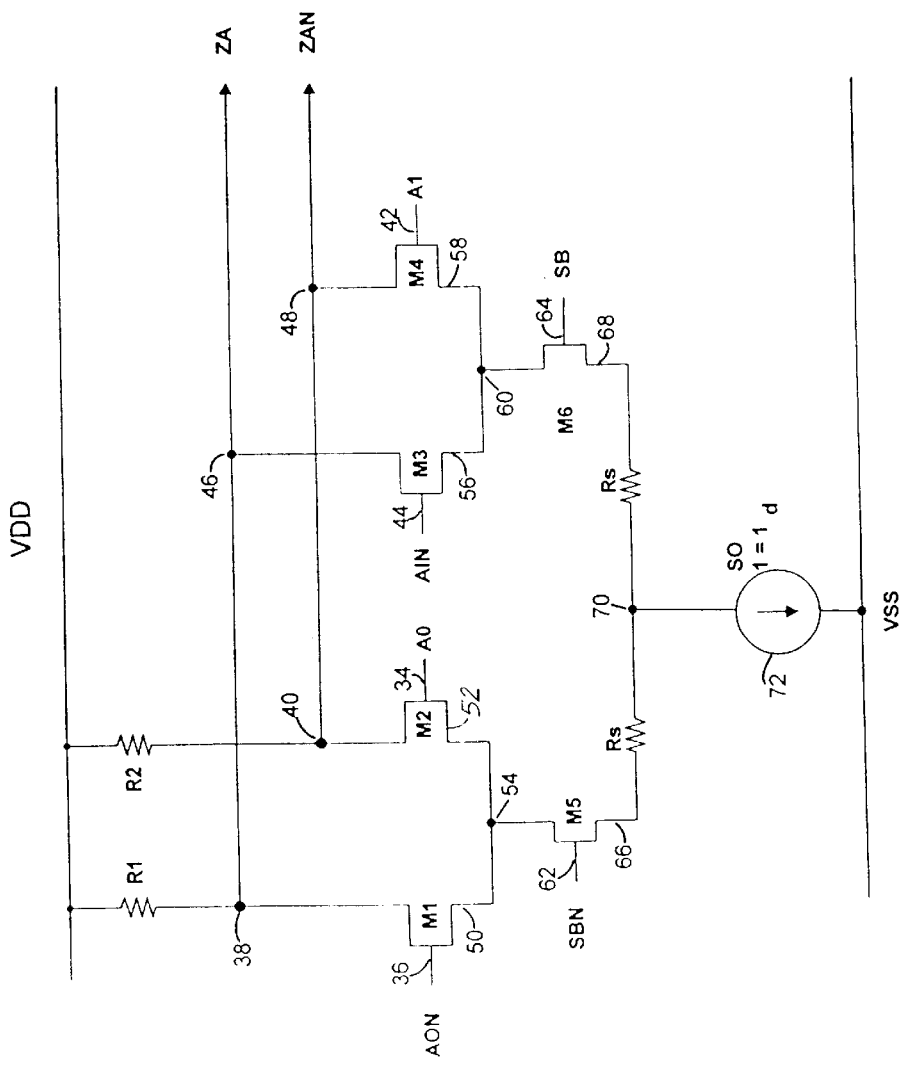
FIG. 5 is a schematic diagram of a multiplexor circuit utilized for phase interpolation according to another embodiment of the present invention.

Referring to FIGS. 1 and 2, phase selection circuit 10 for selecting a phase from signal source 12 generating multi-phase signals 14 is illustrated. As described in detail below, phase selection circuit 10 is implemented utilizing a single stage of multiplexor circuits 16 for receiving phase signals 14 associated with delay taps (not shown) from signal source 12. Multiplexor circuits 16, connected together at their outputs 22, select between a tap 18 and an inverse tap 20 and are activated during the entire operation of phase selection circuit 10. The outputs 22 from multiplexor circuits 16 are analog summed together to create a single phase output signal 24 which may be shifted in phase by one tap 18 by inverting one of the input taps to a multiplexor circuit 16, thus reducing perturbation or glitching at output signal 24. Referring to FIG. 5, phase interpolation is provided for by further phase shifting the output 22 in steps smaller than one tap 18 utilizing multiplexor circuits 32 which interpolate in multiple steps between tap 18 and inverse tap 20. Phase selection circuit 10 provides for provides maximum bandwidth capability, while minimizing mismatch and glitching.

In accordance with the present invention, phase selection circuit 10 provides a one-stage design which leads to good matching characteristics without the reduced bandwidth penalty associated with conventional devices. In particular, the bandwidth is superior to conventional devices because each multiplexor circuit 16 has an effective fanout of only ⅛ in the present invention, rather than a fanout of one. The present invention provides nearly glitch free operation since only one multiplexor circuit 16 is changed at a time, and in addition, even the small amount of glitching that occurs due to the switching of multiplexor circuit 16, is suppressed by the other seven multiplexor circuits 16 which are also driving the output node.

As is illustrated in FIG. 2, phase selection circuit 10 includes a single stage of multiplexor circuits 16 for receiving delay taps corresponding to phase signals from signal source 12, such as phase signals $\phi_{00}$ through $\phi_{15}$ from VCO (not shown). For descriptive purposes, phase selection circuit 10 is described with respect to selecting phases coming off generally equally spaced taps 18 from VCO. Signal source 12 is not limited to VCO but rather can be any conventional or newly developed signal source 12 which can generate two or more evenly spaced signals spanning one-half of an oscillation cycle. Moreover, for descriptive purposes, eight 2×1 multiplexor circuits 16 disposed in a single stage are utilized to receive taps 18 from signal source 12. One skilled in the art will recognize that the number of multiplexor circuits 16 required to implement phase selection circuit 10 is not limited to eight, but rather is determined in accordance with a number of factors, including but not limited to the number of taps 18 from signal source.

Figure 4:
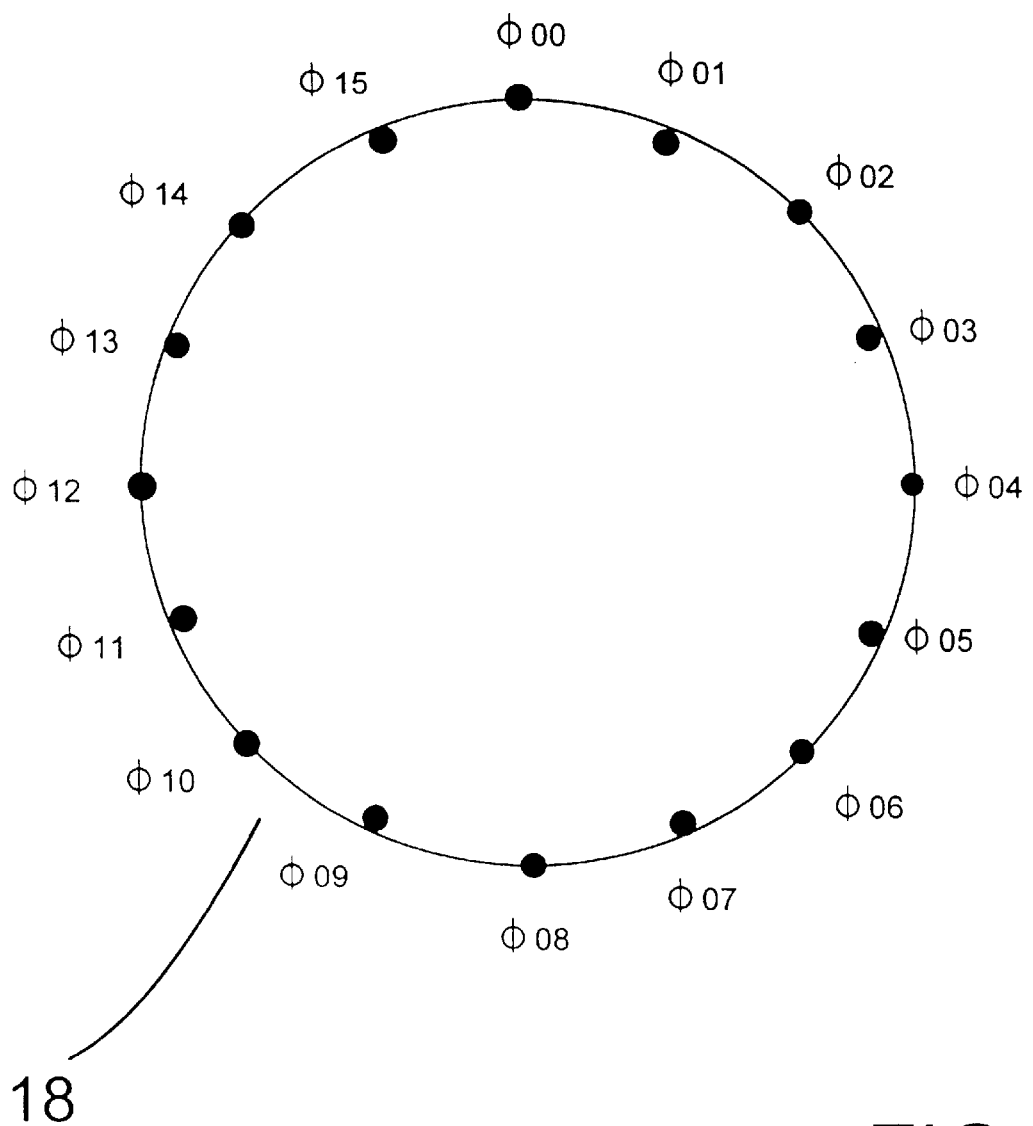
FIG. 4 is a phase diagram showing phase signals $\phi_{00}$ through $\phi_{15}$ which are applied to the phase selection circuit illustrated in FIG. 2.

For illustrative purposes, VCO is implemented as an eight-delay stage ring oscillator which produces eight evenly spaced delay output signals which span one-half of a clock period. Referring to FIG. 4, a phase diagram representing each of the taps 18 from signal source as phases $\phi_{00}$ through $\phi_{15}$, ranging from 0 to 360 degrees, is illustrated. The eight additional delay output signals needed to span one complete clock cycle are generated by inverting the first eight delay output signals. For example, phase signal $\phi_{08}$ is equivalent to the inverse of phase signal $\phi_{00}$, $\phi_{09}$ is equivalent to the inverse of phase signal $\phi_{01}$ and so forth.

Referring to FIGS. 1 and 3(a), the solid lines 24 represent phase signals 14, $\phi_{00}$ through $\phi_{07}$, respectively, corresponding to each of the delay taps 18, A0 through A7, from signal source. The dashed line 26 represents phase signal 14, $\phi_{08}$, from delay tap 20, A8, which is generated by inverting delay tap, 18, A0. In this example, the total phase shift from delay tap 18, A0, to delay tap 18, A7, corresponding to delay phase signals 14, $\phi_{00}$ through $\phi_{07}$, is 180 degrees. The phase shift between each delay tap 18, such as between delay taps 18, A0 and A1, represents approximately 22.5 degrees. A different number of delays could be used or different phase shifts between delays could be established. Implementation of a different number of delays or phase shift between delays would require adjustment of the number of multiplexor circuits 16 required in phase selection circuit 10 shown in FIG. 2.

As is illustrated in FIG. 2, multiplexor circuits 16, connected together at their outputs 22, select between a tap 18 and an inverse tap 20, such as taps 18 corresponding to delay phases $\phi_{00}$ and $\phi_{08}$. In accordance with the present invention, all of the multiplexor circuits 16 are connected together at their outputs 22, and all of the multiplexor circuits 16 are always on. Phase selection circuit 10 operates by summing and selectively inverting all of the VCO taps 18 in an analog fashion. In particular, all of the selected phase outputs 22 from multiplexor circuits 16 are summed or averaged together in an analog fashion. One skilled in the art will recognize that any conventional or newly developed device may be used to sum selected phase outputs 22 together.

Operation of each multiplexor circuit 16 is controlled by the select signal coupled to SB, which selects the desired input phase. Selection between a tap 18 or inverse tap 20 for each multiplexor circuit 16 can be via a thermometer code or any other conventional or newly developed fashion. Each multiplexor circuit 16 switches its selection from a phase to its complement, or vice versa, when a new value of select signal is applied to SB. Phase of output signal 24 $\phi_{out}$ will then follow the average of the eight selected input phases. None of the delay taps 18 from signal source 12 are disabled by phase selection circuit 10 during operation. Rather all of them are summed together, in an analog fashion.

Referring to FIGS. 2 and 3(a), for example, the relationship between nine of the sixteen phase signals 14 generated by VCO implemented as a single stage ring oscillator is shown. In particular, eight evenly spaced taps 18 from VCO, labeled A0, A1, . . . A7, along with inverted phase 20 A8, are shown. The first multiplexor circuit 16 receives delay tap inputs A0 and A8, the second multiplexor circuit 16 receives delay tap inputs A1 and A9, the third multiplexor circuit 16 receives delay tap inputs A2 and A10, the fourth multiplexor circuit 16 receives delay taps A3 and A11, the fifth multiplexor circuit 16 receives delay taps 18 A4 and A12, the sixth multiplexor circuit 16 receives delay taps 18 A5 and A13, the seventh multiplexor circuit 16 receives delay taps 18 A6 and A14 and the eighth multiplexor circuit 16 receives delay taps 18 A7.

Every multiplexor circuit 16 is left on, i.e. none are ever deactivated, during operation of phase selection circuit 10. The selected input phase signals 14 from multiplexor circuits 16 are analog summed together to create a single output phase signal. Referring to FIG. 3(b), for example, the eight selected input phase signals 14 $\phi_{00}$ through $\phi_{07}$ corresponding to delay taps 18 A0 through A7 (shown in FIGS. 2, 3(a) and 3(b)), respectively, when added together, result in output phase signal 28 Y1. Symmetrically, the phase of output phase signal 28 Y1 is equal to the average of the phases of the eight input phase signals 14. Adding input phase signals 14 $\phi_{00}$ through $\phi_{07}$ in accordance with the present invention will generate an output phase signal 24 having the same phase as the phase signal between phases $\phi_{03}$ through $\phi_{04}$ corresponding to a tap value of 3.5.

To change the phase of output phase signal 28 Y1 from 3.5 to 4.5, only one phase signal out of the entire group of input phase signals 14 needs to be changed from its previous phase. This can be done, for example, by inverting tap 18 A0, which will in effect convert it to tap 20 A8. In particular, the first multiplexor circuit 16 selects inverse tap 20 A8, rather than tap 18 A0. The remainder of the multiplexor circuits 16 remain activated. The phase of the group of taps (A1 . . . A8) will be exactly one tap shifted from the group of taps (A0 . . . A7), and likewise output phase signal 30 Y2 will be shifted in phase by exactly one tap from previous output phase signal 28 Y1. To shift the phase of output phase signal 24 again, such as from 4.5 to 5.5, tap A1 would then be inverted to become tap A9. In accordance with the present invention, phase selection circuit 10 selects a group of continuous phases, in the present example eight phases, out of the ring and adds the selected phases together in an analog fashion to generate a desired output phase signal. To adjust the desired output phase signal 24, a different group of eight continuous phases is selected and then analog summed to generate the desired output phase signal 24. Referring to FIG. 4, adjustment of the desired output phase signal 24 results in the group of continuous phases selected being moved around the ring 18.

In a typical operation, when phase error signal from a phase detector is provided to phase selection circuit 10, a delay tap adjustment is made based on the magnitude and polarity of the phase error signal to reduce the phase error to a nominal amount. This dynamic tap adjustment is accomplished when select value signals are provided to phase selection circuit 10. For example, if the initial phase error were to be determined to be 22.5 degrees early, phase selection circuit 10 would be shifted from its previous tap position by inverting one of its tap signals, causing VCO to be shifted in the late direction so that the next phase error from phase detector should be nominal.

Phase adjustment is accomplished by selectively inverting one of the tap signals from its previous tap position. Referring to FIG. 2, the possible select inputs for SB is shown in TABLE 1 as follows:

TABLE 1

| S7 | S6 | S5 | S4 | S3 | S2 | S1 | S0 |
|----|----|----|----|----|----|----|----|
| 0 | 0 | 0 | 0 | 0 | 0 | 0 | 0 |
| 0 | 0 | 0 | 0 | 0 | 0 | 0 | 1 |
| 0 | 0 | 0 | 0 | 0 | 0 | 1 | 1 |
| 0 | 0 | 0 | 0 | 0 | 1 | 1 | 1 |
| 0 | 0 | 0 | 0 | 1 | 1 | 1 | 1 |
| 0 | 0 | 0 | 1 | 1 | 1 | 1 | 1 |
| 0 | 0 | 1 | 1 | 1 | 1 | 1 | 1 |
| 0 | 1 | 1 | 1 | 1 | 1 | 1 | 1 |
| 1 | 1 | 1 | 1 | 1 | 1 | 1 | 1 |
| 1 | 1 | 1 | 1 | 1 | 1 | 1 | 0 |
| 1 | 1 | 1 | 1 | 1 | 1 | 0 | 0 |
| 1 | 1 | 1 | 1 | 1 | 0 | 0 | 0 |
| 1 | 1 | 1 | 1 | 0 | 0 | 0 | 0 |
| 1 | 1 | 1 | 0 | 0 | 0 | 0 | 0 |
| 1 | 1 | 0 | 0 | 0 | 0 | 0 | 0 |
| 1 | 0 | 0 | 0 | 0 | 0 | 0 | 0 |

Referring to FIG. 5, in accordance with an alternative embodiment of the present invention, phase selection circuit serves as a phase interpolator with the ability to output intermediate phases. In particular, multiplexor circuits 16 in phase selection circuit 10 shown in FIG. 2 are modified to select in fractional amounts how much each of its two inputs 18 and 20 is selected. Coarse phase adjustment is performed by shifting the phase of the output signal 24 in steps smaller than one tap. This is accomplished by replacing the 2-to-1 multiplexor circuits 16 which select between a tap 18 and its inverse 20, with multiplexor circuits 32 which can, in addition to selecting between a tap 18 and its inverse tap 20, interpolate in multiple steps between a tap 18 and its inverse tap 20.

Referring to FIG. 5 phase selection circuit may be comprised of a plurality of multiplexor circuits 32 which, rather than being limited to two-state gates, may be utilized as multiple state gates. Multiplexor circuits 32 are preferably implemented in CMOS Current Mode Logic (CML) technology, although other integrated circuit technology may be used as well.

For example, rather than two valid states, the interpolation feature of phase selection circuit 10 in this example is assumed, for illustrative purposes, to have five valid states. In particular, in addition to being able to fully select one of two signals, phase selection circuit 10 is capable of fractionally selecting between the two signals. Referring to TABLE 2, the five available states may be labeled 0, 1, 2, 3 and 4 as follows:

TABLE 2

| SELECT VALUE (STATE) | SBN | SB | ZA |
|---|---|---|---|
| 0 | 1.00 | 0.00 | 1.00*A0 + 0.00*A1 |
| 1 | 0.75 | 0.25 | 0.75*A0 + 0.25*A1 |
| 2 | 0.50 | 0.50 | 0.50*A0 + 0.50*A1 |
| 3 | 0.25 | 0.75 | 0.25*A0 + 0.75*A1 |
| 4 | 0.00 | 1.00 | 0.00*A0 + 1.00*A1 |

One skilled in the art will recognize that multiplexor circuit 32 can be modified to provide for a plurality of interpolation states and is not limited to the five states shown in TABLE 2 or discussed herein.

Referring to FIG. 5, for illustrative purposes, multiplexor circuit 32 is illustrated in detail. One skilled in the art will recognize that other multiplexor circuit configurations may be used as well. Input A0 and its complementary data input A0N are coupled to a pair of differential transistors M2 and M1, respectively. In a typical implementation, A0 and A1 are clock signals which are just a little bit delayed from each other. The clock signals typically come off a VCO (not shown) so that they are just phases of a clock signal and are very close together so that when the signals are mixed, multiplexor circuit 32 interpolates between them because they are the same signals to start with, with one signal just being a little more delayed than the other so multiplexor circuit 32 can tune between the signals. Referring to FIG. 5, input A0 is coupled to the gate 34 of transistor M2 and the complementary data input A0N is coupled to the gate 36 of transistor M1. Transistors M1 and M2 have load resistors R1 and R2, respectively. The drains 38 and 40 of the M1 and M2 transistors are coupled to the ZA and ZAN outputs, respectively.

Similarly, input A1 and its complementary data input A1N are coupled to a pair of differential transistors M4 and M3, respectively. In particular, input A1 is coupled to the gate 42 of transistor M4 and the complementary data input A1N is coupled to the gate 44 of transistor M3. Transistors M3 and M4 have load resistors R1 and R2, respectively. The drains 46 and 48 of the M3 and M4 transistors are coupled to the ZA and ZAN outputs, respectively.

The drains 38, 40, 46 and 48 of transistors M1, M2, M3 and M4 are also coupled to VDD supply via a load resistor. In particular, load resistor R1 is coupled to transistors M1 and M3 and load resistor R2 is coupled to transistors M2 and M4. The source terminals 50 and 52 of transistors M1 and M2 are coupled at junction 54 so as to share a common current regulated by transistor M5, and the source terminals 56 and 58 of transistors M3 and M4 are coupled at 60 so as to share a common current regulated by transistor M6.

The gates 62 and 64 of transistors M5 and M6 are coupled to differential select inputs SBN and SB, respectively. The source terminals 66 and 68 of transistors M5 and M6 are joined at junction 70. A constant current source 72 is connected to supply bias current to each transistor M5 and M6. The current source 72 is connected to the negative supply rail Vss which may, as shown, be tied to ground, although this is not essential. Degeneration resistors Rs may be included to linearize the interpolation function of the multiplexor circuit 32.

In operation, the differential select inputs SB and SBN control the relative amounts of inputs A0 and A1 that contribute to the output signal ZA and ZAN. For example, referring to TABLE 2, in states 0 and 4, the current is steered entirely or substantially entirely through either transistor M5 or M6. In particular, in state 0, the voltages SBN and SB applied to transistors M1 and M2 are 1.00 and 0.00, respectively. In such case, all or substantially all of the current in current source at the bottom flows through transistor M5 because it would be switched fully on and transistor M6 would be switched fully off. In state 4, the voltages SBN and SB applied to transistors M1 and M2 are 0.00 and 1.00, respectively. In such case, all or substantially all of the current in current source at the bottom flows through transistor M6 because it would be switched fully on and transistor M5 would be switched fully off.

In accordance with the present invention, the multiplexor circuit, instead of being used as a 2-to-1 multiplexor, is used as an interpolator in steering either all or part of the current through transistors M5 or M6. In particular, part of the total current could be steered through transistor M5, with the remainder steered through transistor M6. For example, in state 1, the fractional voltages SBN and SB applied to transistors M1 and M2 are 0.75 and 0.25, respectively. In such case, both transistors M5 and M6 would be switched on, with 75% of the current applied to transistor M5 and 25% of the current applied to transistor M6. In the case where not all of the current is steered through transistors M5 or M6, the signal on ZA and ZAN will be a mixture of the two.

Referring to TABLE 3, by replacing the 2-to-1 multiplexor circuits 16 shown in FIG. 2 with the multiplexor circuits 32 shown in FIG. 5, a 64-state selection/interpolation phase selection circuit can be formed as follows:

TABLE 2

| S7 | S6 | S5 | S4 | S3 | S2 | S1 | S0 |
|----|----|----|----|----|----|----|----|
| 0  | 0  | 0  | 0  | 0  | 0  | 0  | 0  |
| 0  | 0  | 0  | 0  | 0  | 0  | 0  | 1  |
| 0  | 0  | 0  | 0  | 0  | 0  | 0  | 2  |
| 0  | 0  | 0  | 0  | 0  | 0  | 0  | 3  |
| 0  | 0  | 0  | 0  | 0  | 0  | 0  | 4  |
| 0  | 0  | 0  | 0  | 0  | 0  | 1  | 4  |
| 0  | 0  | 0  | 0  | 0  | 0  | 2  | 4  |
| 0  | 0  | 0  | 0  | 0  | 0  | 3  | 4  |
| 0  | 0  | 0  | 0  | 0  | 0  | 4  | 4  |
| 0  | 0  | 0  | 0  | 0  | 1  | 4  | 4  |
| 0  | 0  | 0  | 0  | 0  | 2  | 4  | 4  |
| 0  | 0  | 0  | 0  | 0  | 3  | 4  | 4  |
| 0  | 0  | 0  | 0  | 0  | 4  | 4  | 4  |
|    |    |    | *  |    |    |    |    |
|    |    |    | *  |    |    |    |    |
|    |    |    | *  |    |    |    |    |
| 0  | 0  | 4  | 4  | 4  | 4  | 4  | 4  |
| 0  | 1  | 4  | 4  | 4  | 4  | 4  | 4  |
| 0  | 2  | 4  | 4  | 4  | 4  | 4  | 4  |
| 0  | 3  | 4  | 4  | 4  | 4  | 4  | 4  |
| 0  | 4  | 4  | 4  | 4  | 4  | 4  | 4  |
| 1  | 4  | 4  | 4  | 4  | 4  | 4  | 4  |
| 2  | 4  | 4  | 4  | 4  | 4  | 4  | 4  |
| 3  | 4  | 4  | 4  | 4  | 4  | 4  | 4  |
| 4  | 4  | 4  | 4  | 4  | 4  | 4  | 4  |
| 4  | 4  | 4  | 4  | 4  | 4  | 4  | 3  |
| 4  | 4  | 4  | 4  | 4  | 4  | 4  | 2  |
| 4  | 4  | 4  | 4  | 4  | 4  | 4  | 1  |
| 4  | 4  | 4  | 4  | 4  | 4  | 4  | 0  |
| 4  | 4  | 4  | 4  | 4  | 4  | 3  | 0  |
| 4  | 4  | 4  | 4  | 4  | 4  | 2  | 0  |
| 4  | 4  | 4  | 4  | 4  | 4  | 1  | 0  |
| 4  | 4  | 4  | 4  | 4  | 4  | 0  | 0  |
| 4  | 4  | 4  | 4  | 4  | 3  | 0  | 0  |
|    |    |    | *  |    |    |    |    |
|    |    |    | *  |    |    |    |    |
|    |    |    | *  |    |    |    |    |
| 3  | 0  | 0  | 0  | 0  | 0  | 0  | 0  |
| 2  | 0  | 0  | 0  | 0  | 0  | 0  | 0  |
| 1  | 0  | 0  | 0  | 0  | 0  | 0  | 0  |

The inputs to phase selection circuit 10 are represented by sixteen phases $\phi_{00}$ through $\phi_{15}$ which are evenly spaced apart. These sixteen phases represent sixteen coarse adjustment levels across one complete clock cycle. These sixteen phase signals are further subdivided, generating two fine adjustment levels between each coarse adjustment level. Thus, the clock period is divided into 16×4 phase divisions.

Having now described the invention in accordance with the requirements of the patent statutes, those skilled in this art will understand how to make changes and modifications in the present invention to meet their specific requirements or conditions. Such changes and modifications may be made without departing from the scope and spirit of the invention as set forth in the following claims.

What is claimed is:

1. A phase selection circuit for selecting a phase from a signal source generating phase signals, the phase signals having differing phases, comprising:
   a single stage of multiplexor circuits receiving the phase signals from said signal source, wherein said multiplexor circuits are connected together at their outputs, each of said multiplexor circuits receiving at least two phase signals, and each of said multiplexor circuits being active during application of said phase selection circuit.

2. The phase selection circuit claimed in claim 1, wherein said multiplexor circuits receive phase signals from delay taps.

3. The phase selection circuit claimed in claim 2, wherein each of said delay taps comprises a tap and an inverse tap.

4. The phase selection circuit claimed in claim 3, wherein each of said multiplexor circuits comprises a 2×1 multiplexor circuit for receiving said tap and said inverse tap.

5. The phase selection circuit claimed in claim 3, wherein said multiplexor circuits select between phase signals from said tap and said inverse tap.

6. The phase selection circuit claimed in 1, wherein said signal source comprises an oscillator.

7. The phase selection circuit claimed in 6, wherein said phase selection circuit selects phase signals off generally equally spaced taps from said oscillator.

8. The phase selection circuit claimed in claim 2, wherein said multiplexor circuits interpolate in multiple steps between phase signals from said tap and said inverse tap.

9. The phase selection circuit claimed in claim 8, wherein said multiplexor circuits comprise interpolators.

10. The phase selection circuit claimed in claim 9 wherein the multiplexors comprising interpolators have differential select inputs having at least three states.

11. The phase selection circuit claimed in claim 8, wherein the multiplexor circuits each receive a selector having more than two states, the output of the multiplexor circuits varying with each change of state of the selector.

12. The phase selection circuit claimed in claim 8, wherein said multiplexor circuits are implemented in CMOS current mode logic technology.

13. A method for providing an output phase signal, comprising:
   generating a plurality of phase signals;
   receiving said plurality of phase signals using a single stage of a plurality of multiplexor circuits connected together at their outputs, each of the multiplexor circuits being active; and
   providing each of the plurality of multiplexor circuits a select signal.

14. The method claimed in claim 13, wherein said phase signals comprise signals from delay taps.

15. The method claimed in claim 14, wherein each of said delay taps comprises a tap and an inverse tap.

16. The method claimed in claim 13, wherein each of said multiplexor circuits comprises a 2×1 multiplexor circuit for receiving said tap and said inverse tap.

17. The method claimed in claim 13, wherein the select signal provided to each of the plurality of multiplexor circuits selects between a tap and an inverse tap.

18. The method claimed in claim 13, wherein generating a plurality of phase signals further comprises: generating a plurality of phase signals utilizing an oscillator.

19. The method of claim 18, wherein the plurality of phase signals are taken from equally spaced taps from said oscillator.

20. The method claimed in claim 19, wherein the select signal has a number of states greater than two, and each of the states selects in fractional amounts how much each of inputs to said multiplexor circuit is selected.

21. The method claimed in claim 20, wherein said multiplexor circuits are implemented in CMOS current mode logic technology.

* * * * *

UNITED STATES PATENT AND TRADEMARK OFFICE
CERTIFICATE OF CORRECTION

PATENT NO. : 6,229,344 B1
DATED : May 8, 2001
INVENTOR(S) : Greg Warwar

It is certified that error appears in the above-identified patent and that said Letters Patent is hereby corrected as shown below:

Column 7,
Line 13, replace "TABLE 2" with -- TABLE 3 --.

Signed and Sealed this

Nineteenth Day of November, 2002

Attest:

Attesting Officer

JAMES E. ROGAN
Director of the United States Patent and Trademark Office